(12) United States Patent
Thies

(10) Patent No.: US 9,069,013 B2
(45) Date of Patent: Jun. 30, 2015

(54) HIGH-FREQUENCY (HF) TEST PROD

(75) Inventor: Steffen Thies, Ueberackern (AT)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 538 days.

(21) Appl. No.: 13/387,201

(22) PCT Filed: Aug. 31, 2010

(86) PCT No.: PCT/EP2010/005353
§ 371 (c)(1),
(2), (4) Date: Jul. 20, 2012

(87) PCT Pub. No.: WO2011/026608
PCT Pub. Date: Mar. 10, 2011

(65) Prior Publication Data
US 2013/0002238 A1    Jan. 3, 2013

(30) Foreign Application Priority Data
Sep. 2, 2009 (DE) ............... 20 2009 011 899 U

(51) Int. Cl.
*G01R 27/26* (2006.01)
*G01R 31/02* (2006.01)
*G01R 1/067* (2006.01)

(52) U.S. Cl.
CPC ................. *G01R 1/06772* (2013.01)

(58) Field of Classification Search
CPC ....... G01R 31/02; H01L 2021/00; H01R 3/00
USPC ............. 324/754.01, 754.02, 754.03, 754.07, 324/754.08, 754.09, 754.1–754.19, 149, 324/437, 445, 446
See application file for complete search history.

(56) References Cited

U.S. PATENT DOCUMENTS

| 3,317,830 | A  | * | 5/1967  | Winningstad ................ 324/72.5 |
| 6,229,327 | B1 | * | 5/2001  | Boll et al. ................ 324/755.02 |
| 6,310,483 | B1 |   | 10/2001 | Taura et al. |
| 6,836,129 | B2 | * | 12/2004 | Lee .............................. 324/690 |
| 2004/0100295 | A1 |  | 5/2004 | Lee |
| 2007/0159196 | A1 | * | 7/2007 | Hayden et al. ................ 324/754 |

FOREIGN PATENT DOCUMENTS

| EP | 0685742 | 12/1995 |
| WO | 9854586 | 12/1998 |

* cited by examiner

*Primary Examiner* — Patrick Assouad
*Assistant Examiner* — Taqi Nasir
(74) *Attorney, Agent, or Firm* — DeLio, Peterson & Curcio LLC; Robert Curcio

(57) ABSTRACT

A high frequency test prod for electrically contacting at least one contact point of a specimen, using an HF coaxial line to connect the test prod housing and the contact unit electrically and mechanically between the housing and the contact unit, the HF coaxial line having an external conductor, an internal conductor arranged coaxially to the external conductor, and a gas or vacuum dielectric arranged between the external conductor and internal conductor, the external conductor designed as a hollow profile section from a rigid, elastically deformable material, wherein the internal conductor is arranged coaxially to the hollow profile section.

8 Claims, 2 Drawing Sheets

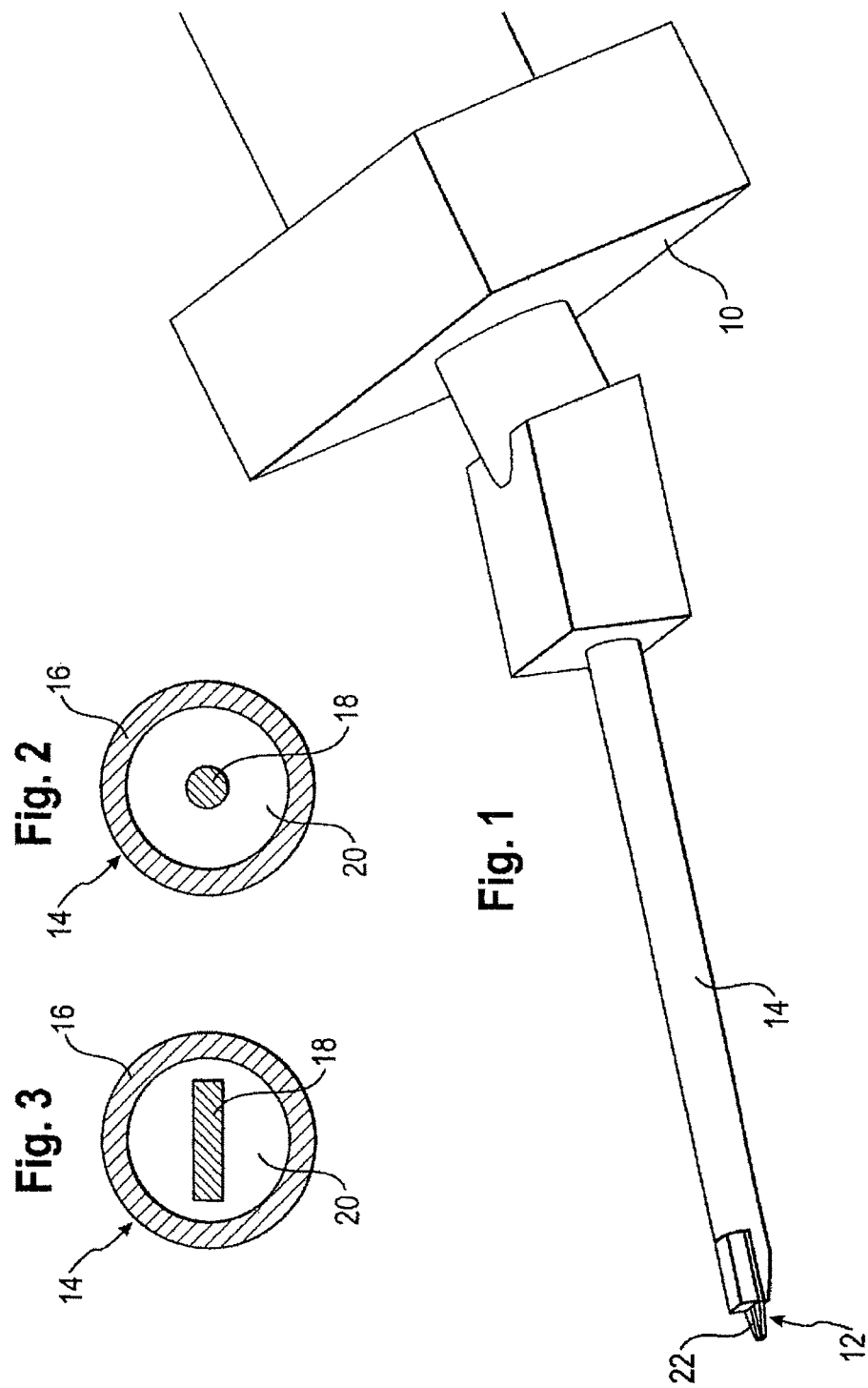

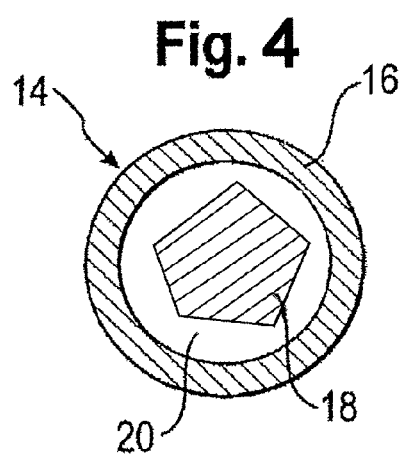
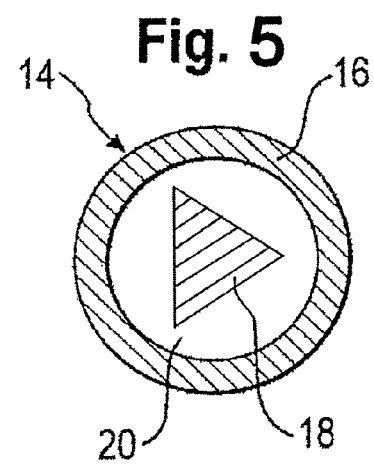
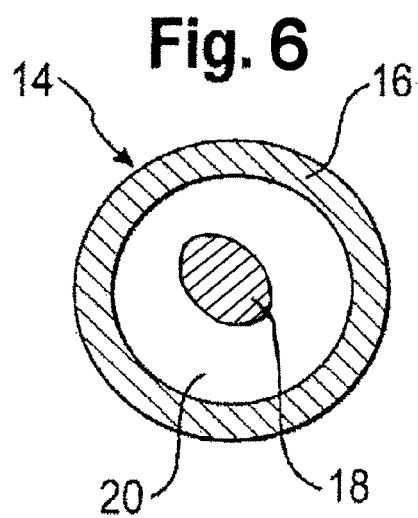

HIGH-FREQUENCY (HF) TEST PROD

This application is a National Stage filing based on PCT/US2010/005353, filed Aug. 31, 2010, and which claims priority to German Patent Application No. DE 20 2009 9011 899.1, filed Sep. 2, 2009.

BACKGROUND OF THE INVENTION

1. Field of the Invention

The invention relates to a high frequency (HF) test prod that includes a housing and a contact unit for electrically contacting at least one contact point of a specimen. An HF coaxial line connects the housing and the contact unit electrically. The HF coaxial line is mechanically arranged between the housing and the contact unit, having an external conductor, an internal conductor arranged coaxially to the external conductor, and a dielectric arranged between the external conductor and internal conductor.

2. Description of Related Art

Generally, with HF test prods, the contact unit, which possesses corresponding contact elements, is used to establish an electrical contact with contact points, such as a planar conductor structure of a specimen, whereby a contact surface and a contact force are necessary in order to establish the electrical contact. In order to allow a predetermined contact force to be applied repeatedly, spring-loaded contact elements are usually provided on the contact unit of the HF test prods. However, in the case of high frequencies these contact elements must, for electrical reasons, be so short that sufficient spring travel is no longer available on the contact elements themselves.

A test prod of this type is known in U.S. Patent Publication No. 2007/0159196 entitled "PROBE FOR COMBINED SIGNALS," published on Jul. 12, 2007 for Hayden, et al., in which the HF line is designed in the form of a coaxial line. The coaxial line can thereby also provide a spring function for the contacting of the contact unit. However, this has the disadvantage that, due to a temperature-dependent length of the coaxial line, an impedance and an electrical length which influences a phasing of a transmitted HF signal cannot be maintained with the necessary accuracy. The coaxial line also displays a hysteresis when yielding and returning which additionally influences the electrical properties of the contacting in an unforeseeable manner.

SUMMARY OF THE INVENTION

Bearing in mind the problems and deficiencies of the prior art, it is therefore an object of the present invention to provide a test prod having reliable contacting by the contact unit and reliable transmission of the signal via the test prod for applications involving high frequencies of 110 GHz or more.

It is another object of the present invention to provide a test prod having an external conductor designed as a hollow profile section to perform a spring function for the contacting of the test prod, so that spring travel and spring contact can be adjusted very precisely through a choice of the type, length and thickness of the material for the hollow profile section.

Still other objects and advantages of the invention will in part be obvious and will in part be apparent from the specification.

The above and other objects, which will be apparent to those skilled in the art, are achieved in the present invention which is directed to a high frequency (HF) test prod comprising: a housing; a contact unit for electrically contacting at least one contact point of a specimen; an HF coaxial line connecting the housing and the contact unit electrically and mechanically, the HF coaxial line arranged between the housing and the contact unit, the HF coaxial line including: an external conductor; an internal conductor coaxial with the external conductor, and a dielectric comprising a gas or a vacuum between the external conductor and internal conductor; the external conductor comprising a hollow profile section from a rigid, elastically deformable material, wherein the internal conductor is arranged coaxially to the hollow profile section.

The HF coaxial line may include at least two or more internal conductors and/or two or more external conductors.

The internal conductor is arranged self-supportingly within the hollow profile section over at least one predetermined section of the hollow profile section. One end of the internal conductor may be fixed to the housing and the other end fixed to the contact unit.

The internal conductor may be surrounded coaxially by the hollow profile section over its entire length between the housing and the contact unit, and arranged at a distance from the hollow profile section.

The internal conductor may comprise a polygonal, rectangular, triangular, oval, or round cross-section.

The hollow profile section forming the external conductor may comprise a polygonal, rectangular, triangular, oval, or round cross-section. The external conductor may further comprise a tube.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1 shows a perspective view of a preferred embodiment of a test prod in accordance with the invention;

FIG. 2 shows a sectional view of an HF conductor of a test prod in accordance with the invention according to a preferred embodiment; and FIG. 3 shows a sectional view of an HF conductor of a test prod in accordance with the invention according to a further preferred embodiment.

FIG. 4 shows a cross-section of an HF conductor of a test prod depicting a polygonal internal conductor.

FIG. 5 shows a cross-section of an HF conductor of a test prod depicting a triangular internal conductor.

FIG. 6 shows a cross-section of an HF conductor of a test prod depicting an oval internal conductor.

DESCRIPTION OF THE PREFERRED EMBODIMENT(S)

In describing the preferred embodiment of the present invention, reference will be made herein to FIGS. 1-3 of the drawings in which like numerals refer to like features of the invention.

The invention is based on the problem of improving a test prod of the aforementioned type such that a reliable contacting by the contact unit and reliable transmission of the signal via the test prod is also achieved for applications involving high frequencies of 110 GHz or more.

According to the invention this problem is solved through a test prod of the aforementioned type with the features identified herein and characterized in the claims.

According to the invention, in a test prod of the aforementioned type the external conductor is designed as a hollow profile section made of a rigid, elastically deformable material, wherein the internal conductor is arranged coaxially to this hollow profile section, wherein the dielectric is a gas or a vacuum.

This has the advantage that only the external conductor designed as a hollow profile section performs a spring function for the contacting of the test prod, so that spring travel and spring contact can be adjusted very precisely through a choice of the type, length and thickness of the material for the hollow profile section. A hysteresis is effectively avoided during the elastic deformation. In this way a precisely predetermined impedance and electrical length of the HF coaxial line is achieved, wherein the impedance and electrical length is largely independent of the spring travel and ambient temperature. The contact unit itself now only needs to provide height equalization.

In a preferred embodiment, the HF line possesses at least two or more internal conductors and/or external conductors.

A particularly good decoupling of the internal conductor from the spring function is achieved in that the internal conductor is arranged self-supportingly within the hollow profile section over at least one predetermined section of the hollow profile section.

A stable fixing of the internal conductor within the hollow profile section is achieved in that one end of the internal conductor is fixed to the housing and the other end is fixed to the contact unit.

A particularly good signal transmission is achieved in that the internal conductor is surrounded coaxially by the hollow profile section over its entire length between the housing and the contact unit and is arranged at a distance from this.

In order to adjust predetermined electrical properties of the HF line, the internal conductor and/or the hollow profile section forming the external conductor are polygonal, rectangular, triangular, oval, or round in cross-section.

A particularly good signal transmission is achieved in that the external conductor is designed as a tube.

The preferred embodiment of a test prod in accordance with the invention represented in FIG. 1 comprises a housing 10 and a contact unit 12 for the electrical contacting of at least one contact point of a specimen (not shown). An HF coaxial line 14 is arranged between the housing 10 and the contact unit 12 which connects these electrically and mechanically.

As can be seen from FIG. 2, the HF coaxial line 14 possesses an external conductor 16, an internal conductor 18 arranged coaxially to the external conductor and a dielectric 20 is arranged between the external conductor 16 and internal conductor 18. According to the invention the dielectric 20 is a gas, in particular air or nitrogen, or a vacuum, and the external conductor 16 is designed as a hollow profile section in the form of a tube with a round cross section made of a rigid, but elastically deformable material. Accordingly, in contrast to a conventional coaxial line, the dielectric does not perform a holding function for the internal conductor 18 within the external conductor 16. The internal conductor 18 is arranged self-supportingly within the rigid tube 16, i.e. over the entire length of the rigid tube 16, and the internal conductor 18 is spaced at a distance from the rigid tube 16 over the length of the internal conductor 18 between the housing 10 and the contact unit 12, and no supports are provided which support the internal conductor 18 against the rigid tube 16. In order to mount the internal conductor 18, this is simply connected, mechanically and electrically, with the housing 10 and the contact unit 12. In an alternative embodiment, which is not shown, supports may be provided.

The contact unit 12 possesses three contact elements 22 which each have free ends for contacting contact points on a specimen and which are adapted to the frequency of the HF signals which are to be transmitted via the test prod. The arrangement of three contact elements 22 is simply exemplary. Two, four, five or more contact elements 22 can be provided. For high frequencies, for example greater than or equal to 110 GHz, these contact elements 22 are very short. Although these contact elements 22 can provide a height equalization between the contact points when placed on corresponding contact points of a specimen, their length is no longer sufficient to provide a corresponding and repeatably identical contact pressure through a corresponding spring resilience from a resting position when the test prod is placed on the specimen.

The design of the test prod in accordance with the invention makes it possible for the spring function to generate a predetermined and repeatable contact pressure and provide a contact surface between a contact point and a contact element 22 through the external conductor 16 in the form of the tube. However, only the external conductor 16 is spring-mounted, since through the self-supporting arrangement of the internal conductor 18 this is substantially decoupled, mechanically, from the external conductor 16. This means that the contact pressure is adjusted solely through a choice of the material for the external conductor 16 as well as through its length, form and wall thickness.

If the dielectric is air or nitrogen, then the HF coaxial line 14 is an air line.

The external conductor 16 designed in accordance with the invention springs back into its resting position from a deflected position without hysteresis. Appropriate choice of the material used for the external conductor 16 results in low temperature sensitivity in terms of the impedance and the electrical length of the HF coaxial line 14. The impedance can be adjusted and maintained very precisely and only low losses occur.

The internal conductor 18 is represented with a round cross section by way of example in FIG. 2. According to another embodiment, the internal conductor has a rectangular cross section, as shown by way of example in FIG. 3.

This test prod in accordance with the invention can also be manufactured economically and to high precision in mass production and provides an impedance control, such that low reflections occur on contacting, for example, a planar structure on a specimen for measuring purposes. The contact elements 22 of the contact unit 12 are designed as a coplanar line. The test prod in accordance with the invention is distinguished through operating frequencies of 110 GHz and higher, wherein the impedance is substantially free of dispersion over the entire coplanar conductor structure of the contact unit 12, irrespective of the operating frequency. The freely spring-loaded design of the external conductor 16 independently of the internal conductor 18 means that a high contact quality between all conductors 22 of the coplanar conductor structure of the contact unit 12 and corresponding contact points of a device which is to be tested is guaranteed, despite contact elements 22 having a short spring travel insufficient for this purpose, whereby the contact quality is not sensitive to the test prod being placed at an angle on the contact points of a planar structure of a specimen. The insufficient spring travel of the contact elements 22 arises due to the technical necessity of making these contact elements 22 very short for use with HF signals of high frequency (greater than or equal to 110 GHz).

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A high frequency (HF) test prod comprising:
    a housing;
    a contact unit for electrically contacting at least one contact point of a specimen;
    an HF coaxial line connecting the housing and the contact unit electrically and mechanically, the HF coaxial line arranged between said housing and said contact unit, said HF coaxial line including:
    an external conductor;
    an internal conductor coaxial with the external conductor; and
    a dielectric comprising a gas or vacuum between the external conductor and internal conductor;
    said external conductor comprising a hollow profile section in the form of an elastically deformable tube from a rigid material performing a spring function for contacting of the test prod, the spring function generating a predetermined and repeatable contact pressure between the at least one contact point and the contact unit, wherein the internal conductor is arranged coaxially to said hollow profile section, the internal conductor being arranged self-supportingly within the hollow profile section over at least one predetermined section of the hollow profile section.

2. The HF test prod of claim 1, including one end of the internal conductor being fixed to the housing and the other end fixed to the contact unit.

3. The HF test prod of claim 1, including the internal conductor being surrounded coaxially by the hollow profile section over its entire length between the housing and the contact unit, and arranged at a distance from the hollow profile section.

4. The HF test prod of claim 1, wherein the internal conductor comprises a polygonal, rectangular, triangular, oval, or round cross section.

5. The HF test prod of claim 1, wherein the hollow profile section forming the external conductor comprises a polygonal, rectangular, triangular, oval, or round cross section.

6. The HF test prod of claim 2, including the internal conductor being surrounded coaxially by the hollow profile section over its entire length between the housing and the contact unit, and arranged at a distance from the hollow profile section.

7. The HF test prod of claim 6, wherein the internal conductor comprises a polygonal, rectangular, triangular, oval, or round cross-section.

8. The HF test prod of claim 7, wherein the hollow profile section forming the external conductor comprises a polygonal, rectangular, triangular, oval, or round cross-section.

* * * * *